United States Patent
Lin et al.

(10) Patent No.: US 11,637,558 B2
(45) Date of Patent: Apr. 25, 2023

(54) ANALOG-TO-DIGITAL CONVERTER CAPABLE OF REDUCING NONLINEARITY AND METHOD OF OPERATING THE SAME

(71) Applicant: Realtek Semiconductor Corp., HsinChu (TW)

(72) Inventors: Kai-Yue Lin, HsinChu (TW); Wei-Jyun Wang, HsinChu (TW); Shih-Hsiung Huang, HsinChu (TW); Kai-Yin Liu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 7 days.

(21) Appl. No.: 17/551,104

(22) Filed: Dec. 14, 2021

(65) Prior Publication Data
US 2022/0393693 A1 Dec. 8, 2022

(30) Foreign Application Priority Data
Jun. 4, 2021 (TW) .................. 110120507

(51) Int. Cl.
*H03M 1/06* (2006.01)
*H03M 1/12* (2006.01)
*H03M 1/46* (2006.01)

(52) U.S. Cl.
CPC ........ *H03M 1/0604* (2013.01); *H03M 1/0673* (2013.01); *H03M 1/12* (2013.01); *H03M 1/1245* (2013.01); *H03M 1/46* (2013.01)

(58) Field of Classification Search
CPC .... H03M 1/0604; H03M 1/12; H03M 1/0673; H03M 1/1245; H03M 1/46
See application file for complete search history.

(56) References Cited

U.S. PATENT DOCUMENTS 8,508,400 B2 8/2013 Wu
10,826,521 B1 11/2020 Huang
(Continued)

FOREIGN PATENT DOCUMENTS

CN 102843140 B 6/2015
CN 111800139 A 10/2020
(Continued)

OTHER PUBLICATIONS

J. Tsai et al., "A 0.003 mm2 10 b 240 MS/s 0.7 mW SAR ADC in 28 nm CMOS With Digital Error Correction and Correlated-Reversed Switching," in IEEE Journal of Solid-State Circuits, vol. 50, No. 6, pp. 1382-1398, Jun. 2015, doi: 10.1109/JSSC.2015.2413850 ,Jun. 2015.
(Continued)

*Primary Examiner* — Joseph J Lauture
(74) *Attorney, Agent, or Firm* — Winston Hsu

(57) ABSTRACT

An analog-to-digital converter includes a switch circuit, a first capacitor array, a second capacitor array and a comparator. A method of operating the analog-to-digital converter includes switching a swap signal to a first level in a first sampling period for the switch circuit to couple the first capacitor array to a first input terminal of the comparator and a first signal source, and couple the second capacitor array to a second input terminal of the comparator and a second signal source, and switching the swap signal to a second level in a second sampling period for the switch circuit to couple the first capacitor array to the second input terminal of the comparator and the second signal source, and couple the second capacitor array to the first input terminal of the comparator and the first signal source.

14 Claims, 5 Drawing Sheets

(56) References Cited

U.S. PATENT DOCUMENTS

2007/0236380 A1* 10/2007 La Rue .............. H03M 1/1245
　　　　　　　　　　　　　　　　　　　341/155
2014/0085118 A1　3/2014　Tsai
2018/0183456 A1　6/2018　Lee

FOREIGN PATENT DOCUMENTS

TW　　201301773 A　1/2013
TW　　201414211 A　4/2014

OTHER PUBLICATIONS

M. Wu, Y. Chung and H. Li, "A 12-bit 8.47-fJ/conversion-step 1-MS/s SAR ADC using capacitor-swapping technique," 2012 IEEE Asian Solid-State Circuits Conference (A-SSCC), Kobe, 2012, pp. 157-160, doi: 10.1109/IPEC.2012.6522649 ,Nov. 2012.

* cited by examiner

ANALOG-TO-DIGITAL CONVERTER CAPABLE OF REDUCING NONLINEARITY AND METHOD OF OPERATING THE SAME

CROSS REFERENCE TO RELATED APPLICATION

This non-provisional application claims priority of Taiwan patent application No. 110120507, filed on 4 Jun., 2021, included herein by reference in its entirety.

BACKGROUND OF THE INVENTION

1. Field of the Invention

The present invention relates to electronic circuits, and in particular, to an analog-to-digital converter and an operating method thereof.

2. Description of the Prior Art

An analog-to-digital converter (ADC) is a device for converting a continuous analog signal into a discrete digital signal. The ADC has found wide applications in audio systems, video systems, communication systems, and other various digital signal processing systems. The successive approximation register (SAR) ADC is an analog-to-digital converter that utilizes capacitor arrays for analog-to-digital conversion. The SAR ADC is low in power consumption and is suitable for use in mobile devices or portable devices. Nevertheless, the SAR ADC has a nonlinear error owing to capacitance mismatch of the capacitor arrays, leading to a reduction in accuracy.

SUMMARY OF THE INVENTION

According to an embodiment of the invention, an analog-to-digital converter includes a first capacitor array, a second capacitor array, a switch circuit, a comparator and a control logic circuit. The switch circuit is coupled to the first capacitor array and the second capacitor array. The comparator is coupled to the switch circuit. The control logic circuit is coupled to the switch circuit. The comparator includes a first input terminal and a second input terminal. A method of operating the analog-to-digital converter includes during a first sampling period, switching a switching signal to a first level for the switch circuit to couple the first capacitor array to the first input terminal of the comparator and a first signal source, and to couple the second capacitor array to the second input terminal of the comparator and a second signal source; and during a second sampling period, switching the switching signal to a second level for the switch circuit to couple the first capacitor array to the second input terminal of the comparator and the second signal source, and to couple the second capacitor array to the first input terminal of the comparator and the first signal source. The control logic circuit switches the switching signal between the first level and the second level according to a uniform sequence during a plurality of sampling periods. The first level and the second level are different from each other.

According to another embodiment of the invention, an analog-to-digital converter includes a first capacitor array, a second capacitor array, a switch circuit, a comparator and a control logic circuit. The comparator includes a first terminal and a second terminal. The switch circuit is coupled to the first capacitor array, the second capacitor array and the comparator, and is used to couple the first capacitor array to the first input terminal of the comparator and a first signal source, and couple the second capacitor array to the second input terminal of the comparator and a second signal source when a switching signal is switched to a first level during a first sampling period, and couple the first capacitor array to the second input terminal of the comparator and the second signal source, and couple the second capacitor array to the first input terminal of the comparator and the first signal source when a switching signal is switched to a second level during a second sampling period. The control logic circuit is coupled to the switch circuit, and is used to switch the switching signal between the first level and the second level according to a uniform sequence during a plurality of sampling periods. The first level and the second level are different from each other.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
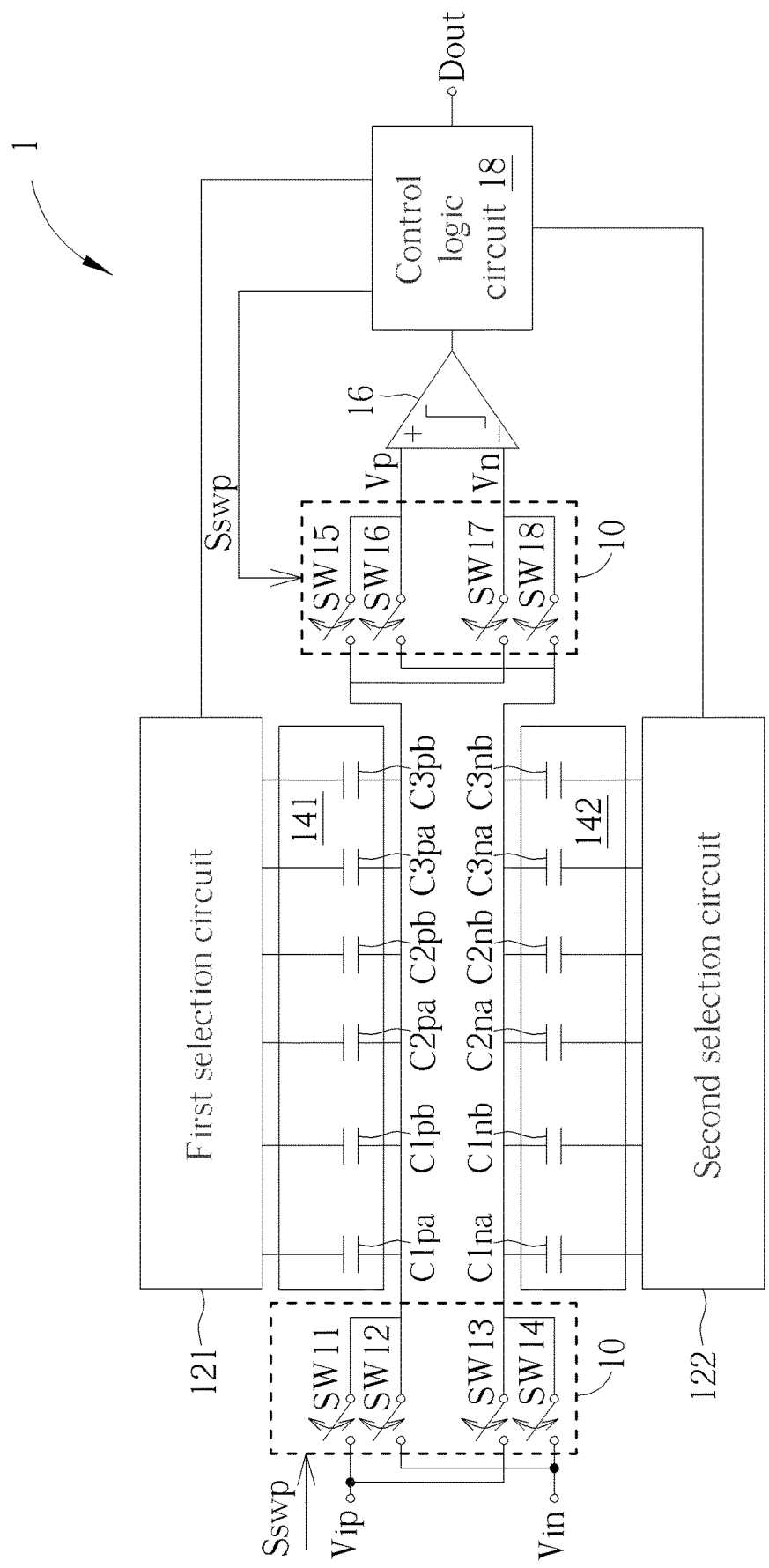
FIG. 1 is a circuit schematic of an analog-to-digital converter according to an embodiment of the invention.

FIG. 1 is a circuit schematic of an analog-to-digital converter 1 according to an embodiment of the invention. The analog-to-digital converter 1 is a 3-bit split capacitor successive approximation register (SAR) analog-to-digital converter, and may be used to convert differential input voltages Vip, Vin into digital output data Dout according to a successive approximation method such as a binary search method. The differential input voltages Vip, Vin may be provided by a first signal source and a second signal source, respectively. The digital output data Dout may include 3 bits. The analog-to-digital converter 1 may generate a set of digital output data Dout in each operation cycle. Each operation cycle may include a sampling stage (also referred to as an acquisition stage) and a quantization stage (also referred to as a conversion stage). The analog-to-digital converter 1 may sample the differential input voltages Vip, Vin during the sampling stage to generate a pair of sample signals, and quantize the pair of sample signals during the quantization stage to generate the digital output data Dout. The quantization stage may include multiple (3) conversions to sequentially generate multiple (3) bits of the digital output data Dout. In a plurality of sampling stages, the analog-to-digital converter 1 may be reset according to two voltage settings, thereby reducing a voltage error owing to a mismatch between capacitive components, reducing an integral nonlinearity (INL) error and a differential nonlinearity (DNL) error, while providing a high-speed analog-to-digital conversion.

The analog-to-digital converter 1 may include a switch circuit 10, a first capacitor array 141, a first selection circuit 121, a second capacitor array 142, a second selection circuit 122, a comparator 16 and a control logic circuit 18. The switch circuit 10 may be coupled to the first capacitor array 141, the second capacitor array 142, the comparator 16 and the control logic circuit 18. The first selection circuit 121 may be coupled to the first capacitor array 141, and the second selection circuit 122 may be coupled to the second capacitor array 142. The comparator 16 may include a first input terminal coupled to the switch circuit 10, a second input terminal coupled to the switch circuit 10, and an output terminal coupled to the control logic circuit 18. The control logic circuit 18 is coupled to the first selection circuit 121 and the second selection circuit 122.

The first capacitor array 141 may include 3 sets of capacitors. The capacitances of the 3 sets of capacitors may be different. Each set of capacitors includes a first capacitor and a second capacitor, and the first capacitor and the second capacitor have substantially equal capacitance. The first set of capacitors of the first capacitor array 141 may include a first capacitor C1pa and a second capacitor C1pb, the second set of capacitors may include a first capacitor C2pa and a second capacitor C2pb, and the third set of capacitors may include a first capacitor C3pa and a second capacitor C3pb. The first set of capacitors, the second set of capacitors, and the third set of capacitors of the first capacitor array 141 may respectively correspond to the most significant bit (MSB) to the least significant bit (LSB) of the digital output data Dout. The first capacitor C1pa and the second capacitor C1pb may have substantially equal capacitance of 3C, respectively, and the first set of capacitors of the first capacitor array 141 may have a capacitance of 6C. The first capacitor C2pa and the second capacitor C2pb may have substantial equal capacitance of 2C, respectively, and the second set of capacitors of the first capacitor array 141 may have a capacitance of 4C. The first capacitor C3pa and the second capacitor C3pb may have substantially equal capacitance of C, respectively, and the third set of capacitors of the first capacitor array 141 may have a capacitance of 2C. Each of the capacitors C1pa, C1pb, C2pa, C2pb, C3pa, C3pb may include an upper plate and a lower plate. The upper plates of the capacitors C1pa, C1pb, C2pa, C2pb, C3pa, C3pb may be coupled to the switch circuit 10.

Similarly, the second capacitor array 142 may also include 3 sets of capacitors. The capacitances of the 3 sets of capacitors may be different. Each set of capacitors includes a first capacitor and a second capacitor, and the first capacitor and the second capacitor have substantially equal capacitance. The first set of capacitors of the second capacitor array 142 may include a first capacitor C1na and a second capacitor C1nb, the second set of capacitors may include a first capacitor C2na and a second capacitor C2nb, and the third set of capacitors may include a first capacitor C2na and a second capacitor C3nb. The first set of capacitors, the second set of capacitors, and the third set of capacitors of the second capacitor array 142 may respectively correspond to the most significant bit to the least significant bit of the digital output data Dout. The first capacitor C1na and the second capacitor C1nb may have substantially equal capacitance of 3C, respectively, and the first set of capacitors of the second capacitor array 142 may have a capacitance of 6C. The first capacitor C2na and the second capacitor C2nb may have substantial equal capacitance of 2C, respectively, and the second set of capacitors of the second capacitor array 142 may have a capacitance of 4C. The first capacitor C2na and the second capacitor C3nb may have substantially equal capacitance of C, respectively, and the third set of capacitors of the second capacitor array 142 may have a capacitance of 2C. Each of the capacitors C1na, C1nb, C2na, C2nb, C2na, C3nb may include an upper plate and a lower plate. The upper plates of the capacitors C1na, C1nb, C2na, C2nb, C2na, C3nb may be coupled to the switch circuit 10.

The first selection circuit 121 may receive the first reference voltage V1 and the second reference voltage V2 to configure the 3 sets of capacitors of the first capacitor array 141, and the second selection circuit 122 may receive the first reference voltage V1 and the second reference voltage V2 to configure the 3 sets of capacitors of the second capacitor array 142. In some embodiments, the first reference voltage V1 may be a supply voltage such as 1.8V, and the second reference voltage V2 may be a ground voltage such as 0V. In other embodiments, the first reference voltage V1 may be a ground voltage, and the second reference voltage V2 may be a supply voltage. The first selection circuit 121 may be coupled to the lower plates of the capacitors C1pa, C1pb, C2pa, C2pb, C3pa, and C3pb. The second selection circuit 122 may be coupled to the lower plates of the capacitors C1na, C1nb, C2na, C2nb, C2na, and C3nb.

The first selection circuit 121 and the second selection circuit 122 may be implemented by one or more multiplexers and/or switches, but are not limited thereto. The one or more of multiplexers and/or switches of the first selection circuit 121 may receive a selection signal from the control logic circuit 18 to select one of the first reference voltage V1 and the second reference voltage V2 to output to the capacitors C1pa, C1pb, C2pa, C2pb, C3pa and C3pb. The one or more of multiplexers and/or switches of the second selection circuit 122 may receive a selection signal from the control logic circuit 18 to select one of the first reference voltage V1 and the second reference voltage V2 to output to the capacitors C1na, C1nb, C2na, C2nb, C2na and C3nb.

The switch circuit 10 may include switches SW11 to SW18. The switch SW11 may include a first terminal coupled to the first signal source, and a second terminal coupled to the first capacitor array 141. The switch SW12 may include a first terminal coupled to the second signal source, and a second terminal coupled to the first capacitor array 141. The switch SW13 may include a first terminal coupled to the first signal source, and a second terminal coupled to the second capacitor array 142. The switch SW14 may include a first terminal coupled to the second signal source, and a second terminal coupled to the second capacitor array 142. The switch SW15 may include a first terminal coupled to the first capacitor array 141, and a second terminal coupled to the first input terminal of the comparator 16. The switch SW16 may include a first terminal coupled to the second capacitor array 142, and a second terminal coupled to the first input terminal of the comparator 16. The switch SW17 may include a first terminal coupled to the first capacitor array 141, and a second terminal coupled to the second input terminal of the comparator 16. The switch SW18 may include a first terminal coupled to the second capacitor array 142, and a second terminal coupled to the second input terminal of the comparator 16.

During the sampling stage, the switch circuit 10 may turn on two of the switches SW11 to SW14 and turn off the remaining two switches according to the switching signal Sswp, and turn on two of the switches SW15 to SW18 and turn off the remaining two switches according to the switching signal Sswp. Consequently, the first capacitor array 141 and the second capacitor array 142 may sample the differential input voltages Vip and Vin, respectively, and the first input terminal and the second input terminal of the comparator 16 may receive the voltages Vp and Vn, respectively.

In the sampling period, the first selection circuit 121 and the second selection circuit 122 may output the voltages in the first voltage setting or the second voltage setting to the capacitors C1pa, C1pb, C2pa, C2pb, C3pa and C3pb and the capacitors C1na, C1nb, C2na, C2nb, C3na and C3nb. Tables 1 and 2 show the first voltage setting and the second voltage setting, respectively:

TABLE 1

| Capacitor | C1pa | C1pb | C2pa | C2pb | C3pa | C3pb |
|---|---|---|---|---|---|---|
| Lower plate voltage | V1 | V2 | V1 | V2 | V1 | V2 |
| Capacitor | C1na | C1nb | C2na | C2nb | C3na | C3nb |
| Lower plate voltage | V1 | V2 | V1 | V2 | V1 | V2 |

TABLE 2

| Capacitor | C1pa | C1pb | C2pa | C2pb | C3pa | C3pb |
|---|---|---|---|---|---|---|
| Lower plate voltage | V2 | V1 | V2 | V1 | V2 | V1 |
| Capacitor | C1na | C1nb | C2na | C2nb | C3na | C3nb |
| Lower plate voltage | V2 | V1 | V2 | V1 | V2 | V1 |

The control logic circuit 18 may switch the switching signal Sswp between the first level and the second level according to a uniform sequence during a plurality of sampling periods, and the first level and the second level are different to each other. In some embodiments, the first level may be the first reference voltage V1, and the second level may be the second reference voltage V2. The uniform sequence may be an alternating sequence, a random sequence or other predetermined sequences. When the uniform sequence is the alternating sequence, the control logic circuit 18 may switch the switching signal Sswp between the first level and the second level in turn. When the uniform sequence is a random sequence, the control logic circuit 18 may randomly switch the switching signal Sswp, and the probabilities of the switching signal Sswp being the first level or the second level are substantially equal. The switches SW11 to SW18 may be turned off or turned on according to the switching signal Sswp. Other predetermined sequences may be sequences that are not fully alternating or fully random. For example, the predetermined sequence includes the switching signal Sswp at the first level for N sampling periods, and at the second level for following N sampling periods. In other embodiments, the sampled information is used to determine that the switching signal Sswp of the predetermined sequence is at the first level or the second level.

In some embodiments, when the switching signal Sswp is at the first level during sampling, the switch circuit 10 may turn on the switches SW11 and SW14 and turn off the switches SW12 and SW13 according to the switching signal Sswp, and turn on the switch SW15 and SW18 and turn off the switches SW16 and SW17 according to the switching signal Sswp. Consequently, the first capacitor array 141 samples the input voltage Vip from the first signal source and the second capacitor array 142 samples the input voltage Vin from the second signal source, resulting in the first input terminal of the comparator 16 receiving voltage Vp and the second input terminal of the comparator 16 receiving the voltage Vn. When the switching signal Sswp is at the second level during sampling, the switch circuit 10 may turn on the switches SW12 and SW13 and turn off the switches SW11 and SW14 according to the switching signal Sswp, and turn on the switches SW16 and SW17 and turn off the switches SW15 and SW18 according to the switching signal Sswp. Consequently, the first capacitor array 141 samples the input voltage Vin from the second signal source and the second capacitor array 142 samples the input voltage Vip from the first signal source, resulting in the first input terminal of the comparator 16 receiving voltage Vp and the second input terminal of the comparator 16 receiving the voltage Vn.

In some embodiments, the switches SW15 to SW18 may be replaced by multiplexers coupled to the output of the comparator 16, or multiplexers and/or logic gates integrated into the control logic circuit 18. In such a configuration, when the switching signal Sswp is at the first level, the first capacitor array 141 may sample the input voltage Vip from the first signal source to output voltage Vp to the first input terminal of the comparator 16, and the second capacitor array 142 may sample the input voltage Vin from the second signal source to output voltage Vn to the second input terminal of the comparator 16. When the switching signal Sswp is at the second level, the second capacitor array 142 may sample the input voltage Vip from the first signal source to output voltage Vp to the first input terminal of the comparator 16, and the first capacitor array 141 may sample the input voltage Vin from the second signal source to output voltage Vn to the second input terminal of the comparator 16.

In other embodiments, when the switching signal Sswp is at the first level during sampling, the switch circuit 10 may turn on the switches SW12 and SW13 and turn off the switches SW11 and SW14 according to the switching signal Sswp, and turn on the switch SW16 and SW17 and turn off the switches SW15 and SW18 according to the switching signal Sswp. Consequently, the first capacitor array 141 samples the input voltage Vin from the second signal source and the second capacitor array 142 samples the input voltage Vip from the first signal source, resulting in the first input terminal of the comparator 16 receiving voltage Vp and the second input terminal of the comparator 16 receiving the voltage Vn. When the switching signal Sswp is at the second level during sampling, the switch circuit 10 may turn on the switches SW11 and SW14 and turn off the switches SW12 and SW13 according to the switching signal Sswp, and turn on the switches SW15 and SW18 and turn off the switches SW16 and SW17 according to the switching signal Sswp. Consequently, the first capacitor array 141 samples the input voltage Vip from the first signal source and the second capacitor array 142 samples the input voltage Vin from the second signal source, resulting in the first input terminal of the comparator 16 receiving voltage Vp and the second input terminal of the comparator 16 receiving the voltage Vn.

In some embodiments, the switches SW11 to SW18 in the switch circuit 10 may be replaced by an input multiplexer and an output multiplexer. During the first sampling period, when the switching signal Sswp is switched to the first level, the input multiplexer couples the first capacitor array 141 to the first signal source and couples the second capacitor array 142 to the second signal source, and the output multiplexer couples the first capacitor array 141 to the first input terminal of the comparator 16 and couples the second capacitor array 142 to the second input terminal of the comparator 16. During the second sampling period, when the switching signal Sswp is switched to the second level, the input multiplexer couples the first capacitor array 141 to the second signal source and couples the second capacitor array 142 to the first signal source, and the output multiplexer couples the first capacitor array 141 to the second input terminal of the comparator 16 and couples the second capacitor array 142 to the first input terminal of the comparator 16. The method of controlling the switching signal Sswp may be found in the preceding paragraphs, and will not be repeated it here.

In the quantization stage, the analog-to-digital converter 1 may perform 3 conversions to generate the 3-bit digital output data Dout, the comparator 16 may compare the voltages Vp and Vn to generate 3 comparison results, and the control logic circuit 18 may store each comparison result as each bit of the digital output data Dout, and set the to the first selection circuit 121 and the second selection circuit 122 according to each comparison result to update the voltages Vp and Vn. The comparison result may be binary "0" or binary "1". For example, when converting the most significant bit, and the switching signal Sswp is switched to a level to turn on the switches SW11, SW14, SW15 and SW18 of the switch circuit 10, if the voltage Vp is greater than the voltage Vn, the comparator 16 may generate a binary "1" as the comparison result, and the control logic circuit 18 may store the binary "1" as the most significant bit and set the first selection circuit 121 to output the ground voltage to the lower plates of the capacitors C1pa and C1pb to pull down the voltage Vp, and set the second selection circuit 122 to output the supply voltage to the lower plates of the capacitors C1na and C1nb to pull up the voltage Vn. The updated voltage Vp will be less than the previous voltage Vp, and the updated voltage Vn will be greater than the previous voltage Vn. If the voltage Vp is less than the voltage Vn, the comparator 16 may generate a binary "0" as the comparison result, and the control logic circuit 18 may store the binary "0" as the most significant bit and set the first selection circuit 121 to output the supply voltage to the lower plates of the capacitors C1pa and C1pb to pull up the voltage Vp, and set the second selection circuit 122 to output the ground voltage to the lower plates of the capacitors C1na and C1nb to pull down the voltage Vn. The updated voltage Vp will be greater than the previous voltage Vp, and the updated voltage Vn will be less than the previous voltage Vn. The analog-to-digital converter 1 may sequentially compare and update the voltages Vp and Vn to generate the 3-bit digital output data Dout, and output the digital output data Dout for the subsequent use.

Figure 1A:
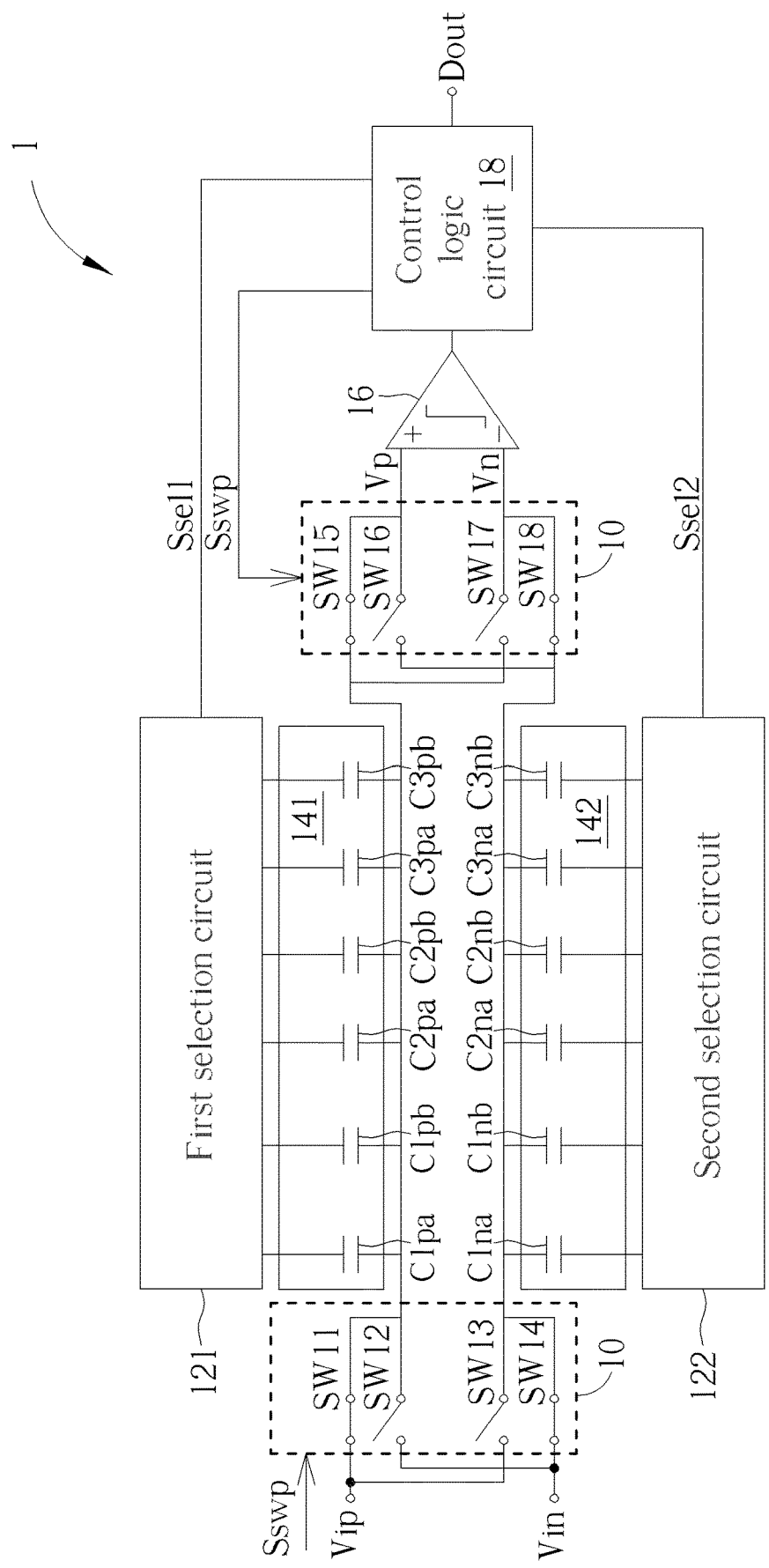
FIG. 1A and FIG. 1B show schematic diagrams of the switching signal in FIG. 1 at the first level and the second level, respectively.
Figure 1B:
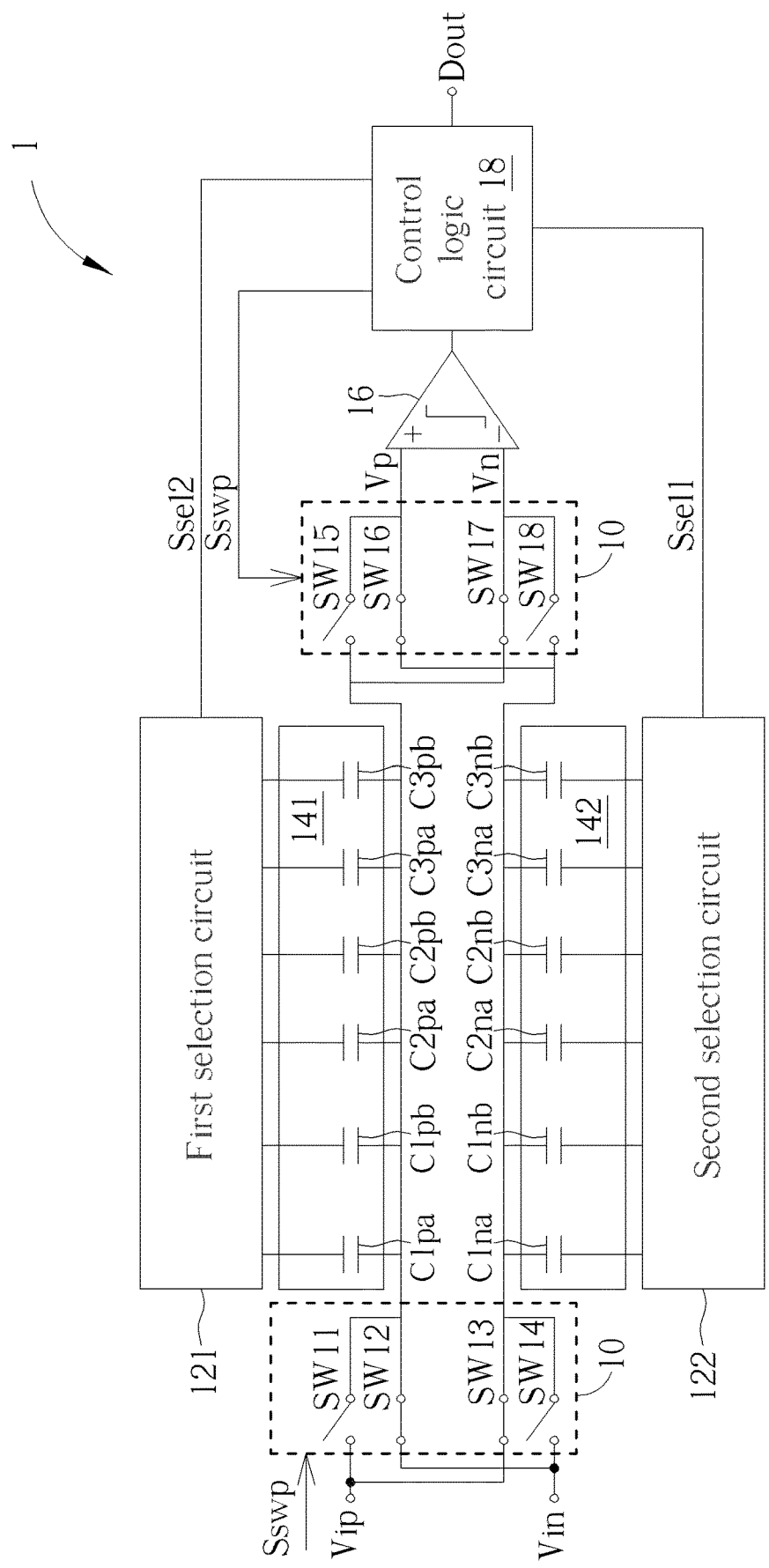

After the switching signal Sswp is switched, the control logic circuit 18 may swap the selection signals to the first selection circuit 121 and the second selection circuit 122. FIG. 1A and FIG. 1B show schematic diagrams of the switching signal Sswp at the first level and the second level, respectively. As shown in FIG. 1A, if the switching signal Sswp is at the first level, the switches SW11, SW14, SW15, and SW18 are turned on, the switches SW12, SW13, SW16, and SW17 are turned off, and the control logic circuit 18 may output the selection signal Ssel1 to the first selection circuit 121 and output the selection signal Ssel2 to the second selection circuit 122. As shown in FIG. 1B, if the switching signal Sswp is at the second level, the switches SW12, SW13, SW16, and SW17 are turned on, the switches SW11, SW14, SW15, and SW18 are turned off, and the control logic circuit 18 may output the selection signal Ssel2 to the first selection circuit 121 and output the selection signal Ssel1 to the second selection circuit 122.

Figure 2:
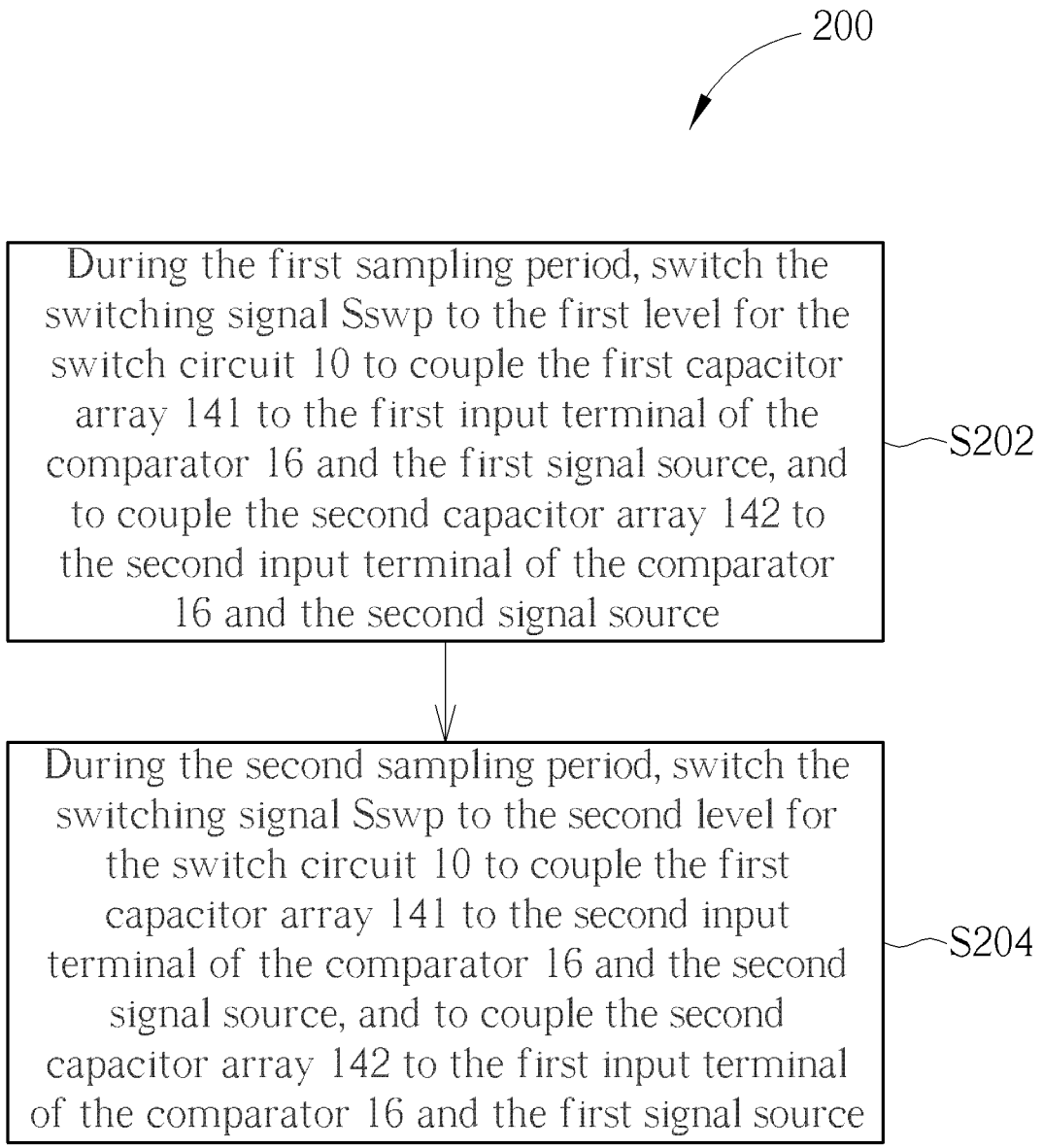
FIG. 2 is a flowchart of a method of operating the analog-to-digital converter in FIG. 1.

FIG. 2 is a flowchart of a method 200 of operating the analog-to-digital converter 1. The method 200 includes Steps S202 and S204 for resetting the first capacitor array 141 and the second capacitor array 142 using the two connection settings during a plurality of sampling periods. Any reasonable Step change or adjustment is within the scope of the disclosure. Steps S202 and S204 are detailed as follows:

Step S202: During the first sampling period, switch the switching signal Sswp to the first level for the switch circuit 10 to couple the first capacitor array 141 to the first input terminal of the comparator 16 and the first signal source, and to couple the second capacitor array 142 to the second input terminal of the comparator 16 and the second signal source;

Step S204: During the second sampling period, switch the switching signal Sswp to the second level for the switch circuit 10 to couple the first capacitor array 141 to the second input terminal of the comparator 16 and the second signal source, and to couple the second capacitor array 142 to the first input terminal of the comparator 16 and the first signal source.

In Step S202, the switching signal Sswp is switched to the first level during the first sampling period, the switch SW11 is turned on to couple the first capacitor array 141 to the first signal source, and the switch SW14 is turned on to couple the second capacitor array 142 to the second signal source, the switch SW15 is turned on to couple the first capacitor array 141 to the first input terminal of the comparator 16, the switch SW18 is turned on to couple the second capacitor array 142 to the second input terminal of the comparator 16, and the switches SW12, SW13, SW16, SW12 are turned off. In Step S204, the switching signal Sswp is switched to the second level during the second sampling period, the switch SW12 is turned on to couple the first capacitor array 141 to the second signal source, the switch SW13 is turned on to couple the second capacitor array 142 to the first signal source, the switch SW17 is turned on to couple the first capacitor array 141 to the second input terminal of the comparator 16, the switch SW16 is turned on to couple the second capacitor array 142 to the first input terminal of the comparator 16, and the switches SW11, SW14, SW15, SW18 are turned off.

Figure 3:
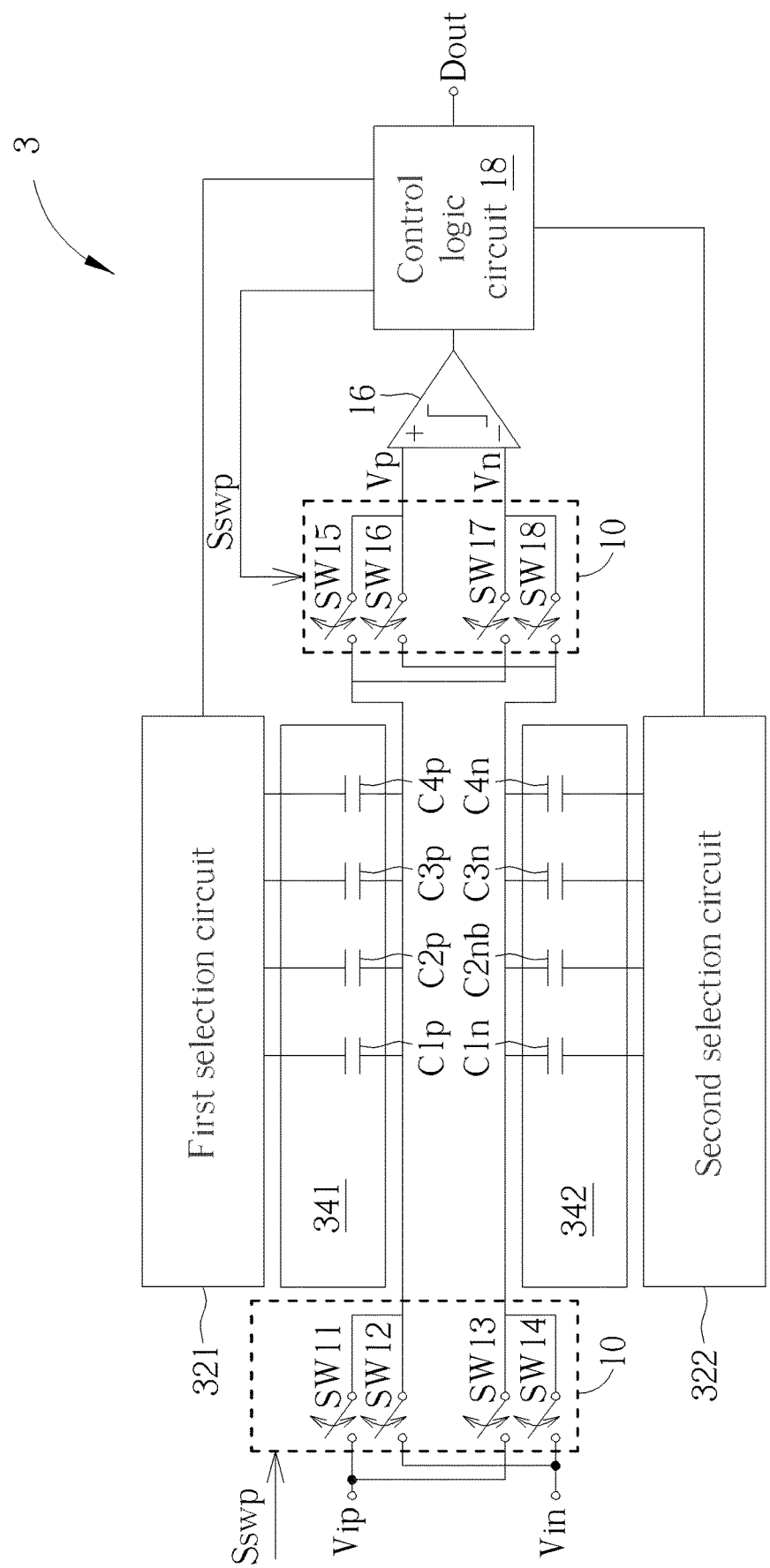
FIG. 3 is a circuit schematic of an analog-to-digital converter according to another embodiment of the present invention.

FIG. 3 is a circuit schematic of an analog-to-digital converter 3 according to another embodiment of the present invention. The analog-to-digital converter 3 may be a monotonic switching/set-and-down switching successive approximation register (SAR) analog-to-digital converter. The difference between the analog-to-digital converter 3 and the analog-to-digital converter 1 is that the analog-to-digital converter 3 uses the first capacitor array 341 and the second capacitor array 342 to replace the first capacitor array 141 and the second capacitor array 142 of the analog-to-digital converter 1, respectively, and the first selection circuit 321 and the second selection circuit 322 are used to replace the first selection circuit 121 and the second selection circuit 122 of the analog-to-digital converter 1, respectively. The differences between the analog-to-digital converter 3 and the analog-to-digital converter 1 are explained as follows. The first capacitor array 341 includes capacitors C1p, C2p, C3p, and C4p, and the second capacitor array 342 includes capacitors C1n, C2n, C3n, and C4n. The first selection circuit 321 may include one or a plurality of multiplexers and/or switches to output the supply voltage or the ground voltage to the capacitors C1p, C2p, C3p, and C4p, respectively, and the second selection circuit 322 may include one or more multiplexers and/or switches to output the supply voltage or the ground voltage to capacitors C1n, C2n, C3n, and C4n, respectively. During the sampling period, the first selection circuit 321 and the second selection circuit 322 may reset the first selection circuit 321 and the second selection circuit 322 according to the voltage setting in Table 3, so as to output the supply voltage VR to the lower plates of the capacitors C1p, C2p, C3p and C4p, and to output the supply voltage VR to the lower plates of the capacitors C1n, C2n, C3n and C4n.

TABLE 3

| Capacitor | C1p | C2p | C3p | C4p |
|---|---|---|---|---|
| Lower plate voltage | VR | VR | VR | VR |
| Capacitor | C1n | C2n | C3n | C4n |
| Lower plate voltage | VR | VR | VR | VR |

During the conversion stage, after the most significant bit is converted, if the voltage Vp is greater than the voltage Vn, the comparator 16 may generate a binary "1" as the comparison result, and the control logic circuit 18 may store the binary "1" as the most significant bit, the first selection circuit 321 may output the ground voltage to the lower plate of the capacitor C1p to update the voltage Vp, and the second selection circuit 322 may output the supply voltage VR to the lower plate of the capacitor C1n to maintain the voltage Vn. The updated voltage Vp will be less than the previous voltage Vp, and the updated voltage Vn will remain unchanged. If the voltage Vp is less than the voltage Vn, the comparator 16 may generate a binary "0" as the comparison result, the control logic circuit 18 may store the binary "0" as the most significant bit, the first selection circuit 321 may output the supply voltage VR to the lower plate of the capacitor C1p to maintain the voltage Vp, and the second selection circuit 322 may output the ground voltage to the lower plate of the capacitor C1n to update the voltage Vn. The updated voltage Vn will be less than the previous voltage Vn, and the updated voltage Vp will remain unchanged. The analog-to-digital converter 3 may sequentially compare and update the voltages Vp and Vn to generate the digital output data Dout.

The analog-to-digital converter 3 may adopt the method 200 to uniformly switch the switching signal Sswp between the first level and the second level during a plurality of sampling periods.

Since the analog-to-digital converters 1, 3 and the operation method 200 are used to switch the switching signal Sswp between the first level and the second level in a uniform manner, the transfer curve of the analog-to-digital converter is equivalently switched between the two settings, resulting in the average nonlinearity error being canceled out in the most bits of the digital output, reducing the differential nonlinearity error and the integral nonlinearity error owing to the capacitance mismatch. In some embodiments, if the capacitor arrays 141 and 142 are 10-bit arrays, and each unit capacitance has a standard deviation of 2% random tolerance, the analog-to-digital converter 1 can adopt the method 200 to reduce the maximum differential nonlinearity error from about 0.37 LSB to 0.3 LSB, and reduce the peak differential nonlinearity error of the digital output data Dout by 0.05 LSB on average, e.g., the peak differential nonlinearity errors at ¼, ⅛, ¹⁄₁₆, ¹⁄₃₂ of the ADC full scale range.

The present invention is not limited to the 3-bit SAR ADC in the embodiment, and those skilled in the art may also apply the method 200 to SAR ADCs of other sizes according to the principle of the present invention. The analog-to-digital converters 1, 3 and the operation method 200 switch the switching signal Sswp between the first level and the second level in a uniform manner, reducing the differential non-linearity error and integral non-linearity error owing to the capacitance mismatch between the same set of capacitors or different sets of capacitors, significantly enhancing the linearity of the SAR ADC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of operating an analog-to-digital converter, the analog-to-digital converter comprising a first capacitor array, a second capacitor array, a switch circuit, a comparator and a control logic circuit, the switch circuit being coupled to the first capacitor array and the second capacitor array, the comparator being coupled to the switch circuit, the control logic circuit being coupled to the switch circuit, the comparator comprising a first input terminal and a second input terminal, the method comprising:
   during a first sampling period, switching a switching signal to a first level for the switch circuit to couple the first capacitor array to the first input terminal of the comparator and a first signal source, and to couple the second capacitor array to the second input terminal of the comparator and a second signal source; and
   during a second sampling period, switching the switching signal to a second level for the switch circuit to couple the first capacitor array to the second input terminal of the comparator and the second signal source, and to couple the second capacitor array to the first input terminal of the comparator and the first signal source;
   wherein the control logic circuit switches the switching signal between the first level and the second level according to a uniform sequence during a plurality of sampling periods, and the first level and the second level are different from each other.

2. The method of claim 1, wherein the analog-to-digital converter further comprises a first selection circuit and a second selection circuit, each set of capacitors in the first capacitor array comprises a first capacitor and a second capacitor having substantially equal capacitance, each set of capacitors in the second capacitor array comprises a first capacitor and a second capacitor having substantially equal capacitance, and the method further comprises:
   in the first sampling period and the second sampling period, the first selection circuit outputting a first reference voltage to the first capacitor in each set of capacitors in the first capacitor array and outputting a second reference voltage to the second capacitor in each set of capacitors in the first capacitor array, and the second selection circuit outputting the first reference voltage to the first capacitor in each set of capacitors in the second capacitor array and outputting the second reference voltage to the second capacitor in each set of capacitors in the second capacitor array.

3. The method of claim 1, wherein the analog-to-digital converter further comprises a first selection circuit and a second selection circuit, the first capacitor array comprises a plurality of capacitors, and the second capacitor array comprises a plurality of capacitors, and the method further comprises:
   in the first conversion period and the second conversion period, the first selection circuit outputting a reference voltage to the plurality of capacitors in the first capacitor array, the second selection circuit outputting the reference voltage to the plurality of capacitors in the second capacitor array.

4. The method of claim 1, wherein the uniform sequence is an alternating sequence.

5. The method of claim 1, wherein the uniform sequence is a random sequence.

6. The method of claim 1, wherein the uniform sequence is a predetermined sequence.

7. An analog-to-digital converter comprising:
a first capacitor array;
a second capacitor array;
a comparator comprising a first terminal and a second terminal;
a switch circuit coupled to the first capacitor array, the second capacitor array and the comparator, and configured to couple the first capacitor array to the first input terminal of the comparator and a first signal source, and couple the second capacitor array to the second input terminal of the comparator and a second signal source when a switching signal is switched to a first level during a first sampling period, and couple the first capacitor array to the second input terminal of the comparator and the second signal source, and couple the second capacitor array to the first input terminal of the comparator and the first signal source when a switching signal is switched to a second level during a second sampling period; and
a control logic circuit coupled to the switch circuit, and configured to switch the switching signal between the first level and the second level according to a uniform sequence during a plurality of sampling periods, the first level and the second level being different from each other.

8. The analog-to-digital converter of claim 7, wherein:
the switch circuit comprises a first switch, a second switch, a third switch, a fourth switch, a fifth switch, a sixth switch, a seventh switch, and an eighth switch;
during the first sampling period, when the switching signal is switched to the first level, the first switch couples the first capacitor array to the first signal source, and the fourth switch couples the second capacitor array to the second signal source, the fifth switch couples the first capacitor array to the first input terminal of the comparator, and the eighth switch couples the second capacitor array to the second input terminal of the comparator; and
during the second sampling period, when the switching signal is switched to the second level, the second switch couples the first capacitor array to the second signal source, and the third switch couples the second capacitor array to the first signal source, the sixth switch couples the first capacitor array to the second input terminal of the comparator, and the seventh switch couples the second capacitor array to the first input terminal of the comparator.

9. The analog-to-digital converter of claim 7, wherein:
the switch circuit comprises an input multiplexer and an output multiplexer;
during the first sampling period, when the switching signal is switched to the first level, the input multiplexer couples the first capacitor array to the first signal source, and couples the second capacitor array to the second signal source, and the output multiplexer couples the first capacitor array to the first input terminal of the comparator, and couples the second capacitor array to the second input terminal of the comparator; and
during the second sampling period, when the switching signal is switched to the second level, the input multiplexer couples the first capacitor array to the second signal source, and couples the second capacitor array to the first signal source, and the output multiplexer couples the first capacitor array to the second input terminal of the comparator, and couples the second capacitor array to the first input terminal of the comparator.

10. The analog-to-digital converter of claim 7, wherein:
the first capacitor array comprises N sets of capacitors, each set of capacitors in the first capacitor array comprising a first capacitor and a second capacitor having substantially equal capacitance, N being a positive integer exceeding 2;
the second capacitor array comprises N sets of capacitors, each set of capacitors in the second capacitor array comprising a first capacitor and a second capacitor having substantially equal capacitance; and
the analog-to-digital converter further comprises:
a first selection circuit coupled to the first capacitor array, and configured to output a first reference voltage to the first capacitor of each set of capacitors in the first capacitor array, and output a second reference voltage to the second capacitor of each set of capacitors in the first capacitor array during a sampling period; and
a second selection circuit coupled to the second capacitor array, and configured to output the first reference voltage to the second capacitor of each set of capacitors in the second capacitor array, and output the second reference voltage to the first capacitor of each set of capacitors in the second capacitor array during the sampling period.

11. The analog-to-digital converter of claim 7, wherein the uniform sequence is an alternating sequence.

12. The analog-to-digital converter of claim 7, wherein the uniform sequence is a random sequence.

13. The analog-to-digital converter of claim 7, wherein the uniform sequence is a predetermined sequence.

14. The analog-to-digital converter of claim 7, wherein:
the first capacitor array comprises N capacitors, N being a positive integer exceeding 2;
the second capacitor array comprises N capacitors; and
the analog-to-digital converter further comprises:
a first selection circuit coupled to the first capacitor array, and configured to output a reference voltage to each capacitor in the first capacitor array during a sampling period; and
a second selection circuit coupled to the second capacitor array, and configured to output the reference voltage to each capacitor in the second capacitor array during the sampling period.

* * * * *